(12) United States Patent
Lin et al.

(10) Patent No.: US 9,029,905 B2
(45) Date of Patent: May 12, 2015

(54) LIGHT EMITTING DIODE DEVICE (71) Applicants: Lite-On Opto Technology (Changzhou) Co., Ltd., Jiangsu Province (CN); Lite-On Technology Corp., Taipei (TW)

(72) Inventors: Chen-Hsiu Lin, Taipei (TW); Kuo-Ming Chiu, Taipei (TW)

(73) Assignees: Lite-On Opto Technology (Changzhou) Co., Ltd., Jiangsu Province (CN); Lite-On Technology Corp., Taipei (TW)

( * ) Notice: Subject to any disclaimer, the term of this patent is extended or adjusted under 35 U.S.C. 154(b) by 0 days.

(21) Appl. No.: 14/308,956

(22) Filed: Jun. 19, 2014

(65) Prior Publication Data

US 2014/0291706 A1    Oct. 2, 2014

Related U.S. Application Data

(63) Continuation-in-part of application No. 14/135,610, filed on Dec. 20, 2013.

(60) Provisional application No. 61/982,395, filed on Apr. 22, 2014.

(30) Foreign Application Priority Data

Dec. 21, 2012  (CN) .......................... 2012 1 0563777
Oct. 30, 2013  (CN) .......................... 2013 1 0526939

(51) Int. Cl.
*H01L 33/00* (2010.01)
*H01L 33/52* (2010.01)
*H01L 23/00* (2006.01)
*H01L 25/075* (2006.01)
*H01L 33/60* (2010.01)

(52) U.S. Cl.
CPC ........... *H01L 33/52* (2013.01); *H01L 2933/005* (2013.01); *H01L 24/48* (2013.01); *H01L 2224/78301* (2013.01); *H01L 2224/85181* (2013.01); *H01L 2224/92247* (2013.01); *H01L 2224/48137* (2013.01); *H01L 2224/48465* (2013.01); *H01L 2224/73265* (2013.01); *H01L 24/78* (2013.01); *H01L 24/85* (2013.01); *H01L 2224/48455* (2013.01); *H01L 2224/85444* (2013.01); *H01L 2924/00014* (2013.01); *H01L2924/12041* (2013.01); *H01L 25/0753* (2013.01); *H01L 33/60* (2013.01)

(58) Field of Classification Search
CPC ....... H01L 33/14; H01L 33/36; H01L 33/486; H01L 33/60; H01L 33/20; H01L 33/62; H01L 33/54; H01L 33/58
USPC ........................... 257/98–100, 79, 81, 88, 84
See application file for complete search history.

(56) References Cited

U.S. PATENT DOCUMENTS

2011/0309404 A1*  12/2011  Lee ................................ 257/99
2013/0168726 A1*   7/2013  Park et al. ..................... 257/100

*Primary Examiner* — Hoa B Trinh
(74) *Attorney, Agent, or Firm* — Rosenberg, Klein & Lee (57) ABSTRACT

A light emitting diode (LED) device includes: a substrate having a central portion; an LED chip unit formed on the central portion of the substrate; a circuit pattern having a positive electrode and a negative electrode that are formed on the substrate, each of the positive electrode and the negative electrode including an arc portion and at least one extending portion that extends from the arc portion toward the central portion; a wire unit connecting the LED chip unit to the extending portions; a glass layer disposed on the substrate, covering the arc portions and including an opening unit that is aligned with the central portion of the substrate; a dam structure formed on the glass layer and extending along the arc portions; and an encapsulated body disposed substantially within the dam structure to cover the extending portions, the wire unit and the LED chip unit.

23 Claims, 11 Drawing Sheets

Substrate sample A

Substrate sample B

Substrate sample C

Substrate sample D

FIG. 10

LIGHT EMITTING DIODE DEVICE

CROSS-REFERENCE TO RELATED APPLICATION

This application is a continuation in part application of U.S. patent application Ser. No. 14/135,610, filed Dec. 20, 2013, currently pending, and claiming priority to Chinese patent application no. 201210563777.X, filed Dec. 21, 2012, and claims priority to U.S. provisional application No. 61/982,395, filed on Apr. 22, 2014, and Chinese patent application no. 201310526939.7, filed on Oct. 30, 2013. The disclosures of these prior applications are incorporated herein by reference.

BACKGROUND OF THE INVENTION

1. Field of the Invention

The invention relates to a light emitting device, more particularly to a light emitting device having a structural arrangement for improving lighting efficiency, substrate reflectivity and chip arrangement density.

2. Description of the Related Art

A conventional light emitting diode (LED) device generally includes a package structure formed by encapsulating a substrate on which small and lightweight LED chip(s) and a circuit pattern are formed with a silicone resin. Along with the increase in light emitting efficiency of the LED device, the silicone resin tends to age or crack due to increase in light and heat originating from the LED device operating at a high power density for a period of time, and the risk of sulfurization of a silver-containing circuit pattern is raised. Besides, if the LED device includes a brittle ceramic substrate, the ceramic substrate is easy to crack.

Therefore, there is still a need in the art to have an LED device with an increased number of LED chips, an improved reflectivity of the ceramic substrate and a reduced cracking risk of the encapsulated resin.

SUMMARY OF THE INVENTION

Therefore, an object of the present invention is to provide a light emitting diode device that can alleviate the aforesaid drawbacks of the prior art.

By virtue of the abovementioned structural arrangement, the LED device provided by this invention is able to be mounted with an increased number of LED chips and to have an improved reflectivity of the ceramic substrate and a reduced cracking risk of the encapsulated resin under requirements of high light emitting efficiency and high power density.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Before the present invention is described in greater detail, it should be noted that like elements are denoted by the same reference numerals throughout the disclosure.

Figure 1:
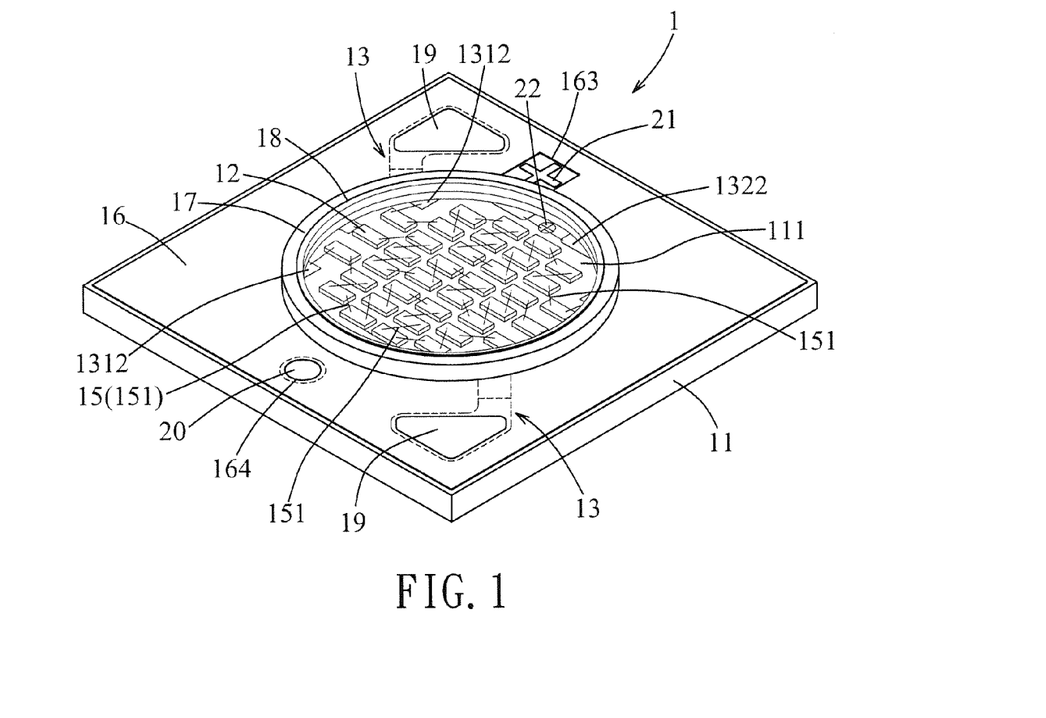
FIG. 1 is a schematic view of an LED device of the preferred embodiment according to this invention.
Figure 2:
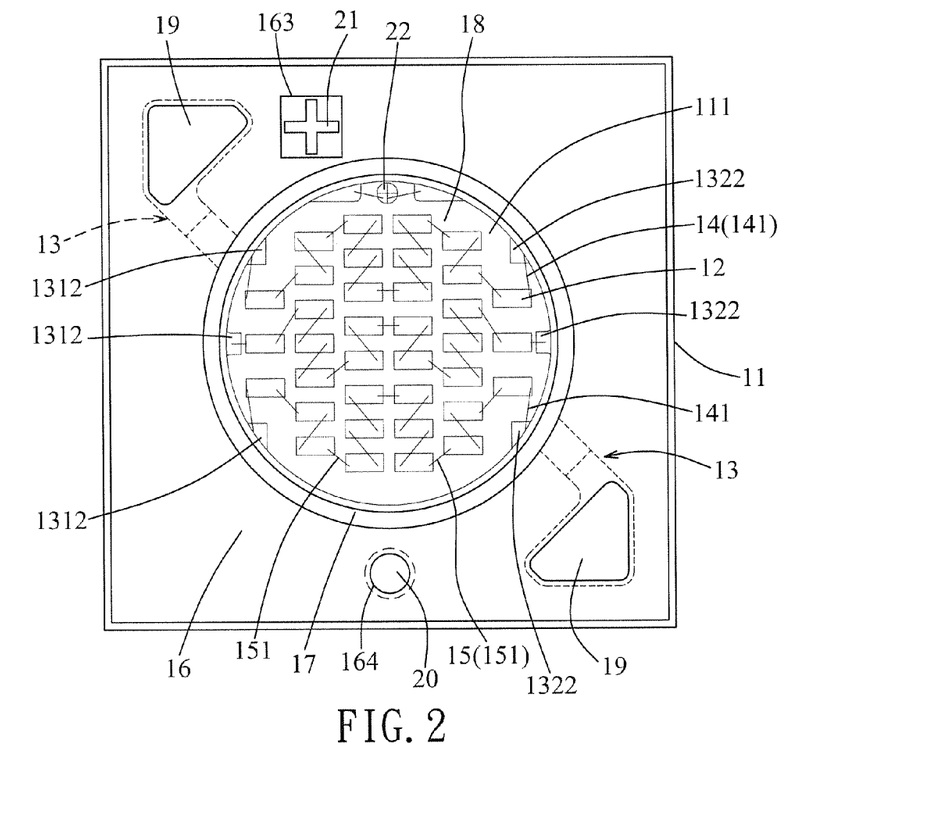
FIG. 2 is a top view illustrating the LED device of the preferred embodiment with a first LED chip unit arrangement.
Figure 3:
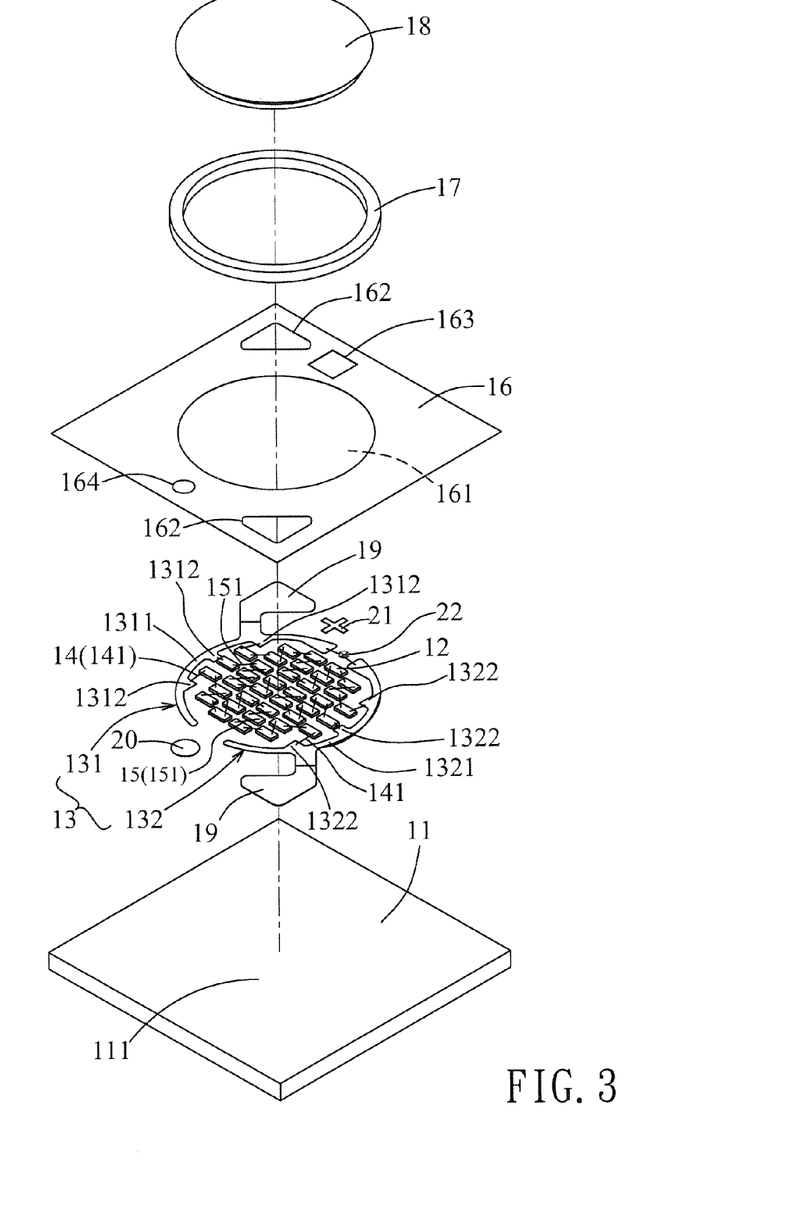
FIG. 3 is an exploded view of the LED device of the preferred embodiment shown in FIG. 2.

Referring to FIGS. 1 to 3, a light emitting diode (LED) device 1 of the preferred embodiment includes a substrate 11 having a central portion 111, an LED chip unit 12 including a plurality of LED chips and formed on the central portion 111 of the substrate 11, a first wire unit 14 connecting at least one LED chip of the LED chip unit 12 to a circuit pattern 13, a second wire unit 15 connecting any two adjacent ones of the LED chips of the LED chip unit 12 in a series manner, a glass layer 16 disposed on the substrate 11, a dam structure 17 formed on the glass layer 16 and an encapsulated body 18 that is disposed substantially within the dam structure 17.

The circuit pattern 13 has a positive electrode 131 and a negative electrode 132 that are formed on the substrate 11. Each of the positive electrode 131 and the negative electrode 132 includes an arc portion 1311, 1321 that surrounds the central portion 111, and at least one extending portion 1312, 1322 that extends from the arc portion 1311, 1321 toward the central portion 111. The extending portion 1312 of the positive electrode 131 is opposite to the extending portion 1322 of the negative electrode 132.

The wire unit 14 connects the LED chip unit 12 to the extending portions 1312, 1322 of the positive electrode 131 and the negative electrode 132.

The glass layer 16 partially covers the arc portions 1311, 1321 of the positive electrode 131 and the negative electrode 132 and including an opening unit aligned with the central portion 111 of the substrate 11.

The dam structure 17 is formed on the glass layer 16 and extends along the arc portions 1311, 1321 of the positive electrode 131 and the negative electrode 132.

The encapsulated body 18 is disposed within the dam structure 17 to cover the extending portions 1312, 1322 of the positive electrode 131 and the negative electrode 132, the LED chip unit 12 and the first and second wire units 14, 15.

Preferably, the substrate 11 is made from a ceramic material. In order to enhance light efficiency and brightness of the LED device 1, the LED chip unit 12 have a plurality of LED chips mounted the substrate 11. However, heat generated from the LED chips is required to be properly dissipated so as to maintain the reliability of the LED device 1.

Preferably, the substrate 11 includes an aluminum oxide-based material mixed with at least one of zirconium (Zr), calcium (Ca), barium (Ba), and magnesium (Mg). Preferably, the substrate 11 is made from a composite material selected from the group consisting of $Al_2O_3$—$Zr$, $Al_2O_3$—$ZrO_2$, $Al_2O_3$—$BaAl_2$—$Si_2O_8$, $Al_2O_3$—$CaAl_2$—$Si_2O_8$, and $Al_2O_3$—$MgAl_2O_4$.

Since the aluminum oxide powder has a coefficient of heat conductivity of 30 W/mk and the zirconium oxide powder has a coefficient of heat conductivity of 3 W/mk, increase in the amount of the zirconium oxide powder used in the substrate 11 tends to reduce the overall coefficient of heat conductivity of the substrate 11. If the amount of the zirconium oxide powder is greater than 30%, the sinterability of the substrate 11 is reduced and the zirconium oxide powder tends to be exposed to the surface of the substrate 11 and compactness of the substrate 11 is reduced and becomes insufficient.

More preferably, the substrate 11 has a coefficient of heat conductivity at 25° C. ranging from 15 to 24 W/mk, more preferably from 18 to 24 W/mk.

Preferably, the substrate 11 has an apparent porosity not greater than 0.0% and a surface roughness (Rz) ranging from 0.5 to 1 μm so as to prevent reagents for electroless deposition of the circuit pattern 13 from permeating into the substrate 11.

Figure 4:
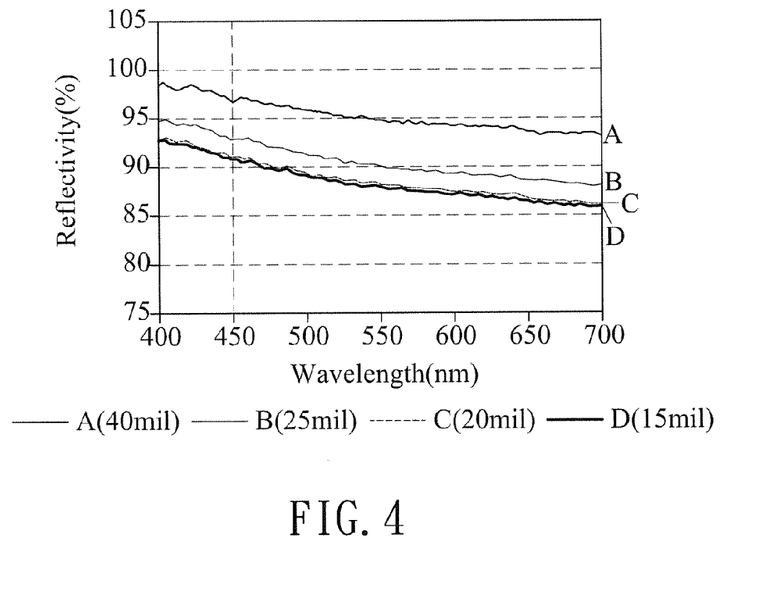
FIG. 4 is a plot illustrating the wavelength vs. reflectivity relationship of a substrate of the LED device of the preferred embodiment with different thicknesses.

Referring to FIG. 4, test results of wavelength vs. reflectivity relationship of the substrate 11 with different thicknesses are explained. Curve A illustrates the wavelength vs. reflectivity relationship of the substrate 11 having a thickness of 40 mil and it is shown that the substrate 11 of 40 mil in thickness has a light reflectivity of 96.7% at 450 nm. Curve B illustrates the wavelength vs. reflectivity relationship of the substrate 11 having a thickness of 25 mil and it is shown that the substrate of 25 mil in thickness has a light reflectivity of 92.8% at 450 nm. Curve C illustrates the wavelength vs. reflectivity relationship of the substrate 11 having a thickness of 20 mil and it is shown that the substrate 11 of 20 mil in thickness has a light reflectivity of 91% at 450 nm. Curve D illustrates the wavelength vs. reflectivity relationship of the substrate 11 having a thickness of 15 mil and it is shown that the substrate 11 of 15 mil in thickness has a light reflectivity of 90.8% at 450 nm. It is also noted from FIG. 4 that, when the thickness of the substrate 11 is increased from 15 mil to 40 mil, the reflectivity of the substrate 11 will increase about 6%.

Preferably, the substrate 11 has a thickness ranging from 0.8 to 1.2 mm so as to achieve an improved reflectivity of the substrate 11.

Preferably, the substrate 11 has a reflectivity of not less than 97% at a wavelength range of 400 nm to 450 nm. Alternatively, the substrate 11 has a reflectivity more than 100% at a wavelength range below 400 nm. Especially, the reflectivity as mentioned herein needs to be reduced by a relative valve for standard calibration of 5% for normalization.

In consideration of porosity property of the substrate 11, the apparent porosity (PA) of the substrate 11 is determined by the formula of:

$$PA(\%) = [(Ww - Wd)/(Ww - Ws)] \times 100\%,$$

wherein Wd stands for the weight of the substrate 11 when is dried; Ws stands for the weight of said substrate 11 when is suspended in the water; and Ww stands for the weight of the substrate 11 when is removed from the water.

Figure 10:
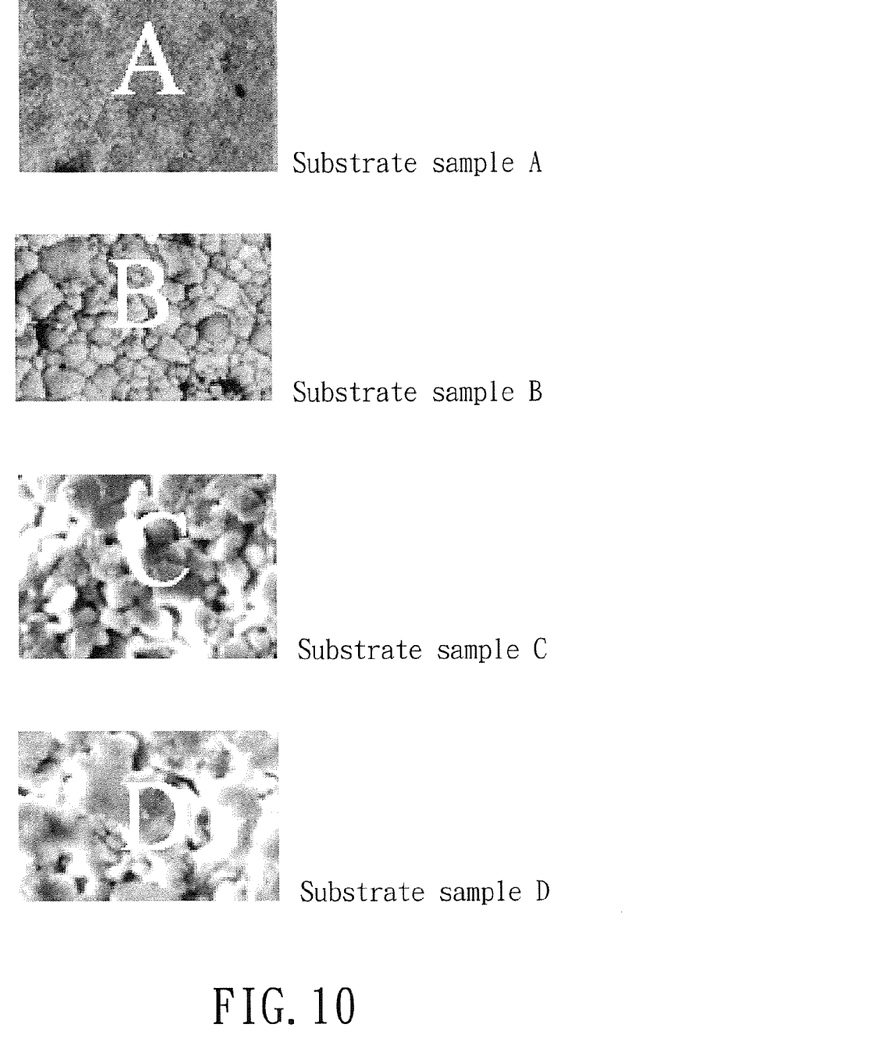
FIG. 10 shows scanning electron microscope (SEM) pictures of substrates selectable for the LED device of the preferred embodiment.

The inventors have tested several substrate samples (substrate A to substrate D) having the properties shown in Table 1. It can be concluded from the properties shown in Table 1 that the apparent porosity (PA) of the substrate 11 is proportional to the light reflectivity and that the apparent porosity (PA) of the substrate 11 is inversely proportional to the coefficient of heat conductivity (K). The SEM pictures of the substrates A to D are shown in FIG. 10.

TABLE 1

| Substrate | Wd | Ws | Ww | PA | Rz | Reflectivity (450 nnm) | K (W/mk) |
|---|---|---|---|---|---|---|---|
| A | 0.826 | 0.613 | 0.213 | 0.0% | x | 84.3% | 24.0 |
| B | 1.169 | 0.869 | 0.300 | 0.0% | 0.62 | 101.6% | 18.5 |
| C | 1.517 | 1.098 | 1.684 | 28.5% | 4.5 | 104.2% | 5.59 |
| D | 1.853 | 1.337 | 1.859 | 1.1% | 2.4 | 97.0% | 22.75 |

Specifically, from Table 1, the substrate A has an apparent porosity of 0.0%, a reflectivity of 84.3%, and a coefficient of heat conductivity of 24 W/mk. The substrate B has an apparent porosity of 0.0%, a reflectivity of 101.6%, and a coefficient of heat conductivity of 18.5 W/mk. The substrate C has an apparent porosity of 28.5%, a reflectivity of 104.2%, and a coefficient of heat conductivity of 5.59 W/mk. The substrate D has an apparent porosity of 1.1%, a reflectivity of 97%, and a coefficient of heat conductivity of 22.75 W/mk.

In consideration of high reflectivity, the substrate C has the best performance. However, the coefficient of heat conductivity of the substrate C is unacceptably poor (the worst). In consideration of balance between high reflectivity and heat-dissipation capacity (i.e., thermal conduction), the substrate B is the better choice for the substrate 11 of the LED device 1.

Referring to FIGS. 5A, 5B and 6A to 6C, different chip unit arrangements of the LED device 1 are illustrated. In the first LED chip unit arrangement shown in FIG. 5A, each of the positive electrode 131 and the negative electrode 132 includes four spaced apart extending portions so as to form four pairs of oppositely spaced apart extending portions 1312, 1322. Preferably, three of the four pairs of the oppositely spaced apart extending portions 1312, 1322 are adapted to be electrically connected to the LED chip unit 12. The remaining one of the four pairs of the oppositely spaced apart extending portions 1312, 1322 is adapted to be electrically connected to a Zener diode 22. Therefore, the LED device 1 is capable of ESD (Electrostatic Discharge) protection.

Figure 5A:
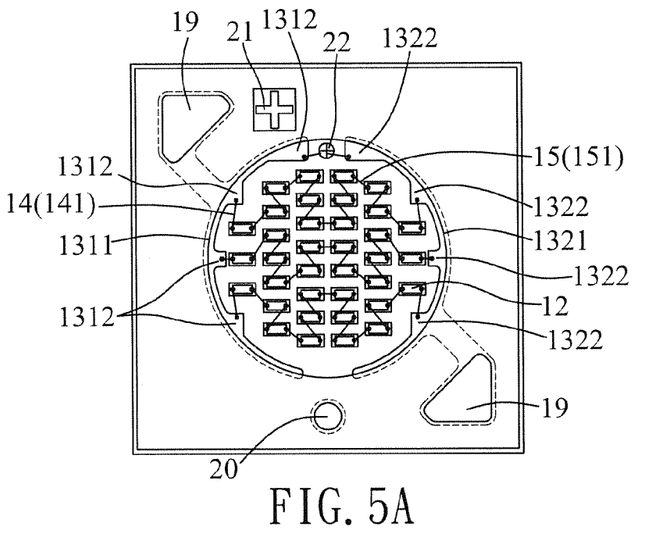
FIG. 5A is a top view illustrating the LED device of the preferred embodiment with the first LED chip unit arrangement.

Each of the four pairs of the oppositely spaced apart extending portions 1312, 1322 may have a special geometrical shape. Preferably, each of the four pairs of the oppositely spaced apart extending portions 1312, 1322 may be triangle-shaped or rectangle-shaped.

The LED chip unit 12 includes three LED chip groups. Each of the three LED chip groups is electrically connected between the oppositely spaced apart extending portions 1312, 1322 of a corresponding one of the four pairs by two corresponding first wires 141 of the first wire unit 14. Each LED chip group includes twelve LED chips that are connected with each other through the corresponding second wires 151 of second wire unit 15 in a series manner. The remaining one of the four pairs of oppositely spaced apart extending portion 1312, 1322 is connected to the Zener diode 22.

Figure 5B:
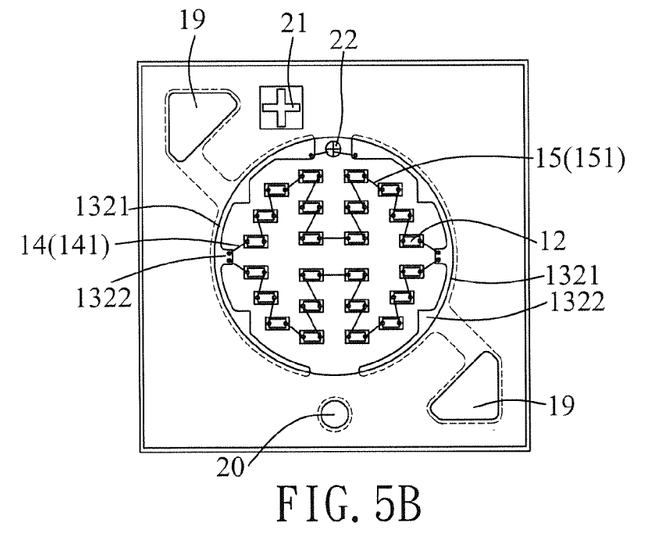
FIG. 5B is a top view illustrating the LED device of the preferred embodiment with a second LED chip unit arrangement.

The second LED chip unit arrangement shown in FIG. 5B is substantially the same as the first LED chip unit arrangement of FIG. 5A except that the LED chip unit 12 includes two LED chip groups that are separately and electrically connected between the oppositely spaced apart extending portions 1312, 1322 of one of the four pairs in a parallel manner. One of the four pairs of oppositely spaced apart extending portion 1312, 1322 is provided for the Zener diode 22. More specially, two of the four pairs of the oppositely spaced apart extending portion 1312, 1322 are not bonded by the first wire unit 14. In an alternative embodiment, each of the positive electrode 131 and the negative electrode 132 may include two spaced apart extending portions so as to form two pairs of oppositely spaced apart extending portions 1312, 1322, one of which is adapted to be connected to the two LED chip groups of the LED chip unit 12 and the other of which is adapted to be connected to the Zener diode 22.

Figure 6A:
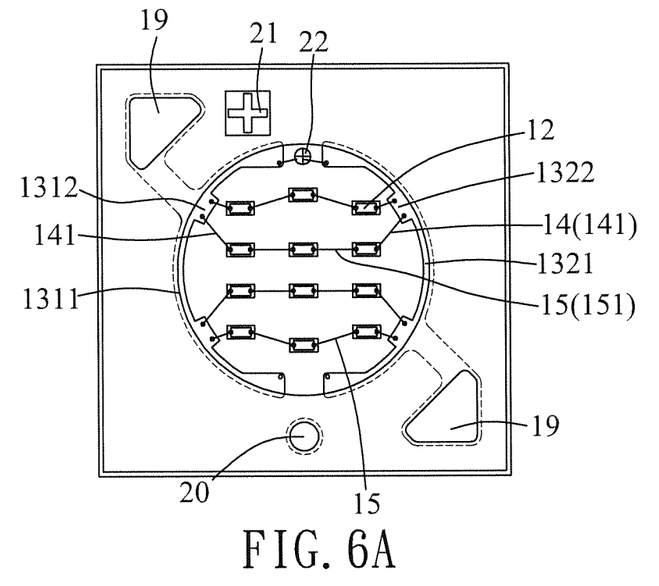
FIG. 6A is a top view illustrating the LED device of the preferred embodiment with a third LED chip unit arrangement.

The third LED chip unit arrangement shown in FIG. 6A is substantially the same as the first LED chip unit arrangement of FIG. 5A except that the LED chip unit 12 includes two LED chip groups that are respectively and electrically connected between the oppositely spaced apart extending portions 1312, 1322 of two of the four pairs. Each LED chip group includes two LED chip sub-groups connected in a parallel manner. Each of the two LED chip sub-groups includes three LED chips that are connected with each other through the wire unit 15 in a series manner. In this embodiment, two of the four pairs of the oppositely spaced apart extending portions 1312, 1322 adapted to be connected to the LED chip unit 12 are occupied. One of the four pairs of the oppositely spaced apart extending portion 1312, 1322 is connected to the Zener diode 22 are occupied. Another one of the four pairs of the oppositely spaced apart extending portion 1312, 1322 is not bonded by the first wire unit 14. In an alternative embodiment, each of the positive electrode 131 and the negative electrode 132 may include three spaced apart extending portions so as to form three pairs of oppositely spaced apart extending portions 1312, 1322, two of which are adapted to be connected to the two LED chip groups of the LED chip unit 12 and the remaining one of which is adapted to be connected to the Zener diode 22.

Figure 6B:
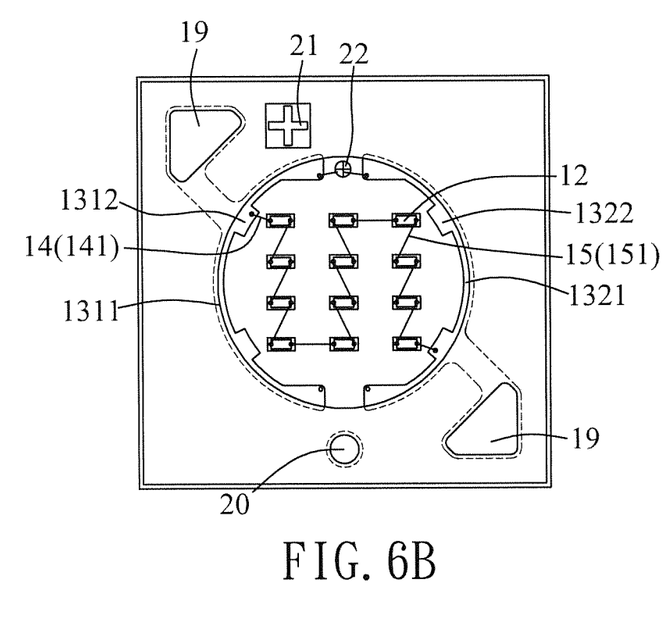
FIG. 6B is a top view illustrating the LED device of the preferred embodiment with a fourth LED chip unit arrangement.

The fourth LED chip unit arrangement shown in FIG. 6B is substantially the same as the first LED chip unit arrangement of FIG. 5A except that the LED chip unit 12 includes one LED chip group that is electrically connected between the oppositely spaced apart extending portions 1312, 1322 of one of the four pairs. The LED chip group includes twelve LED chips connected in a series manner. Another one of the four pairs of the oppositely spaced apart extending portions 1312, 1322 is connected to the Zener diode 22. In an alternative embodiment, each of the positive electrode 131 and the negative electrode 132 may include two spaced apart extending portions so as to form two pairs of oppositely spaced apart extending portions 1312, 1322, one of which are adapted to be connected to the LED chip group of the LED chip unit 12 and the other of which is adapted to be connected to the Zener diode 22.

Figure 6C:
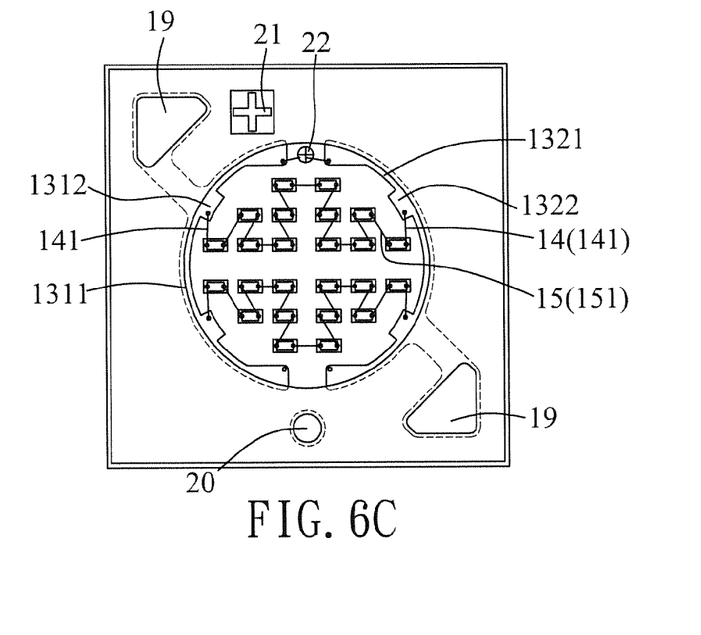
FIG. 6c is a top view illustrating the LED device of the preferred embodiment with a fifth LED chip unit arrangement.

The fifth LED chip unit arrangement shown in FIG. 6C is substantially the same as the first LED chip unit arrangement of FIG. 5A except that the LED chip unit 12 includes two LED chip groups that are respectively and electrically connected between the oppositely spaced apart extending portions 1312, 1322 of the two of the four pairs. Each of the LED chip group includes twelve LED chips connected in a series manner. In this embodiment, two of the four pairs of the oppositely spaced apart extending portions 1312, 1322 adapted to be connected to the LED chip unit 12 and one of the four pairs of the oppositely spaced apart extending portions 1312, 1322 adapted to be connected to the Zener diode 22. More specially, one of the four pairs of the oppositely spaced apart extending portion 1312, 1322 is not bonded by the first wire unit 14. In an alternative embodiment, each of the positive electrode 131 and the negative electrode 132 may include three spaced apart extending portions so as to form three pairs of oppositely spaced apart extending portions 1312, 1322, two of which are adapted to be connected to the two LED chip groups of the LED chip unit 12 and the remaining one of which is adapted to be connected to the Zener diode 22.

Referring back to FIGS. 5A to 5B, four pairs of the oppositely spaced apart extending portion 1312, 1322 are existed. One of the four pairs of the oppositely spaced apart extending portions 1312, 1322 are rectangle-shaped. Three of the four pairs of the oppositely spaced apart extending portions 1312, 1322 are triangle-shaped.

In FIGS. 6A to 6C, four pairs of the oppositely spaced apart extending portion 1312, 1322 exist. The oppositely spaced apart extending portions 1312, 1322 of two of the four pairs of are rectangle-shaped. The oppositely spaced apart extending portions 1312, 1322 of the other two of the four pairs of are triangle-shaped.

Referring back to FIG. 3, each of the positive electrode 131 and the negative electrode 132 further includes a terminal portion 19. The terminal portion 19 is connected to the respective arc portion 1311, 1321 so as to power the LED chip unit 12 through the terminal portion 19.

Preferably, the circuit pattern 13 further includes a sensing portion 20 that is separated from the positive electrode 131 and the negative electrode 132 and that is capable of sensing temperature generated by the LED chip unit 12 disposed on the central portion 111 of the substrate 11.

Preferably, the circuit pattern 13 further includes a mark portion 21 that is substantially located adjacent to one of the positive electrode 131 and the negative electrode 132 for marking a polarity of the one of the positive and negative electrodes 131, 132.

Preferably, the opening unit of the glass layer 16 has a first opening 161 for exposing the central portion 111 of the substrate 11 and the extending portions 1312, 1322 of the positive electrode 131 and the negative electrode 132, two second openings 162 for exposing the terminal portions 19 of the positive and negative electrodes 131, 132, a third opening 163 for exposing the mark portion 21, and a fourth opening 164 for exposing the sensing portion 20.

Figure 7A:
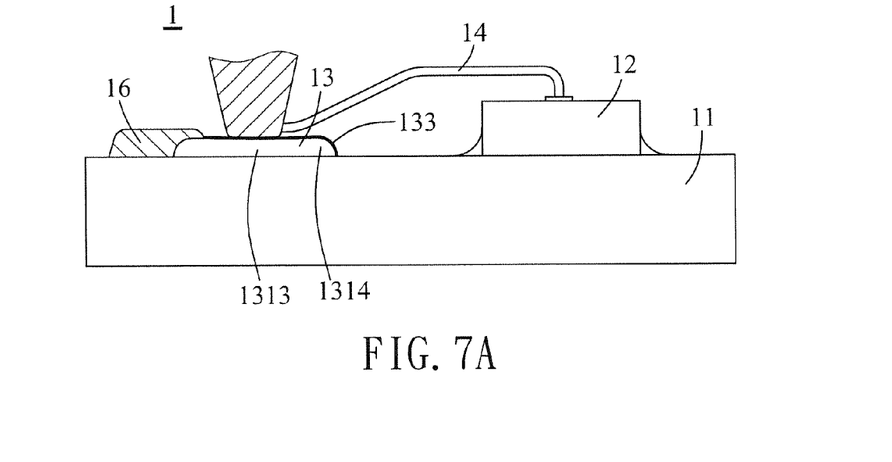
FIG. 7A is a fragmentary partly-sectional view illustrating electrical connection between an LED chip unit and a circuit pattern of the LED device of the preferred embodiment by wire-bonding.
Figure 7B:
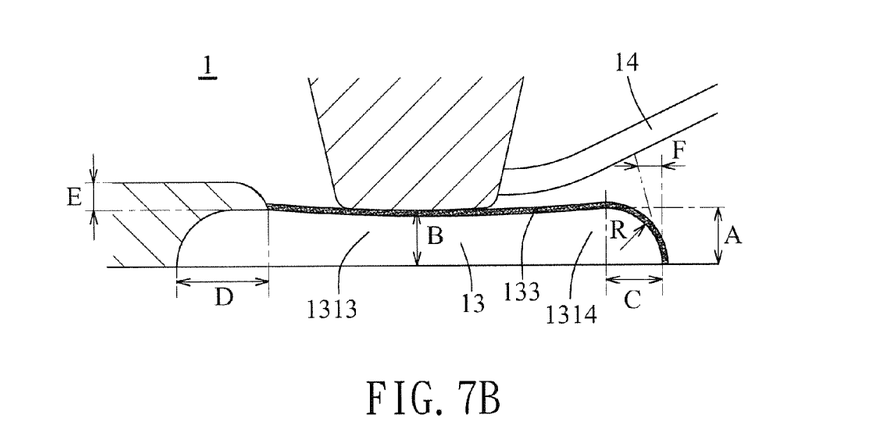
FIG. 7B is a fragmentary partly-sectional view illustrating a wire-bonding area of the circuit pattern of the LED device of the preferred embodiment.

FIG. 7A is a fragmentary partly-sectional view illustrating electrical connection between the LED chip unit 12 and the circuit pattern 13 of the LED device 1 of the preferred embodiment by wire-bonding, and FIG. 7B is a fragmentary partly-sectional view illustrating a wire-bonding area of the circuit pattern 13 of the LED device 1 of the preferred embodiment. In this embodiment, the circuit pattern 13 made of silver or copper is formed on the substrate 11 by screen printing process. In combination with FIGS. 1 to 3, the extending portions 1312, 1322 of the circuit pattern 13 have a curved surface for being connected to the first wire unit 14. The curved surface of each extending portion 1312, 1322 has a highest point whose height is labeled as A and a lowest point whose height is labeled as B. The distance between the highest point and a top surface of the substrate 11 is greater than 15 µm. The distance between the lowest point and the top surface of the substrate 11 is greater than 9 μm. The surface roughness Rz defined by the distance between the highest point and the lowest point is greater than 6 μm. Each of the extending portions 1312, 1322 of the positive and negative electrodes 131, 132 has a wire-bonding sub-portion 1313 formed with the lowest point and a peripheral sub-portion 1314 that extends from the wire-bonding sub-portion 1313 in a direction away from the arc portion 1311. The peripheral sub-portion 1314 has a radian labeled as R, an inclined angle labeled as F that is larger than 5 degrees and an extension length that is labeled as C and greater than 70 μm in the direction.

Furthermore, a Ni/Au or NiPdAu layer 133 is further formed on the circuit pattern 13 and is not covered by the glass layer 16. In other words, the glass layer 16 only covers the circuit pattern 13.

Also referring to FIGS. 7A and 7B in combination with FIGS. 1 to 3, the glass layer 16 partially covers the circuit pattern 13 and having a portion superimposed on the arc portions 1311, 1321. The portion has a width D larger than 150 μm and a thickness E larger than 10 μm so as to enhance adhesion of the glass layer 16 to the circuit pattern 13. The distance between a peripheral edge of the substrate 11 and the periphery edge of the glass layer 16 is about 200 μm so that damage to the glass layer 16 during dicing operation of the LED device 1 is avoided.

Figure 8A:
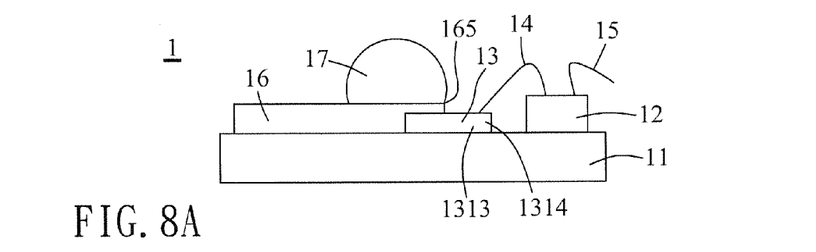
FIGS. 8A and 8B are schematic views illustrating a one-layer dam structure of the LED device that covers a glass layer of the LED device of the preferred embodiment.
Figure 8B:
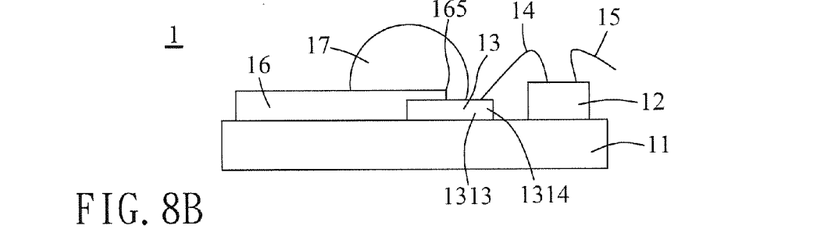

FIGS. 8A and 8B are sectional views, illustrating the dam structure 17 with one-layer form. In FIG. 8A, the dam structure 17 is formed on the glass layer 16 and the circuit pattern 13. In this embodiment, a peripheral edge 165 of the glass layer 16 is exposed from the dam structure 17. In FIG. 8B, the dam structure 17 is formed on the glass layer 16 and the circuit pattern 13. In this embodiment, the peripheral edge 165 of the glass layer 16 exposed in FIG. 8A is embedded within the dam structure 17. By embedding the glass layer 16 in the dam structure 17, the reflectivity of the LED device 1 is improved.

Figure 8C:
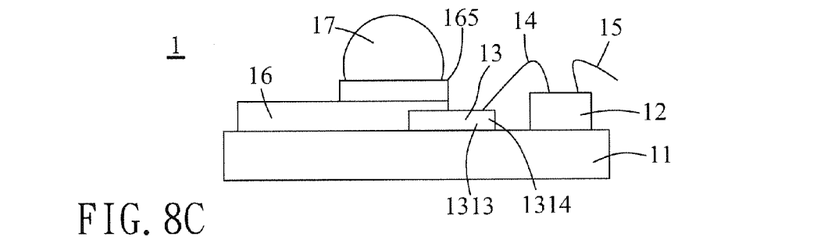
FIGS. 8C and 8D are schematic views illustrating a two-layer dam structure of the LED device that covers on the glass layer of the LED device of the preferred embodiment.
Figure 8D:
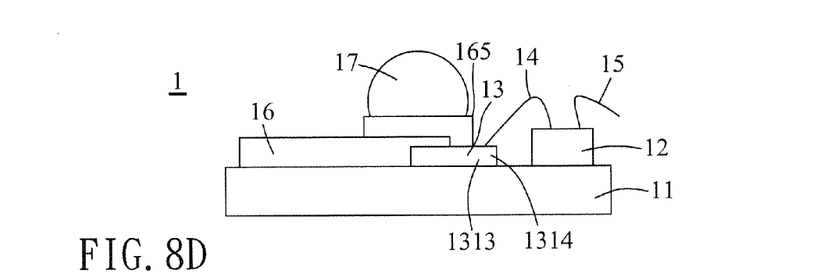

FIGS. 8C and 8D are section views, illustrating the dam structure 17 with two-layer form. The dam structure 17 shown in FIG. 8C is similar to that of FIG. 8A except for the two-layer configuration of the dam structure 17. The dam structure 17 shown in FIG. 8D is similar to that of FIG. 8B except for the two-layer configuration of the dam structure 17.

In addition, referring to FIG. 1, the first and second wire units 14, 15 are only covered by the encapsulated body 18 instead of being covered by both the dam structure 17 and the encapsulated body 18. Generation of broken wires can be avoided.

Figure 9:
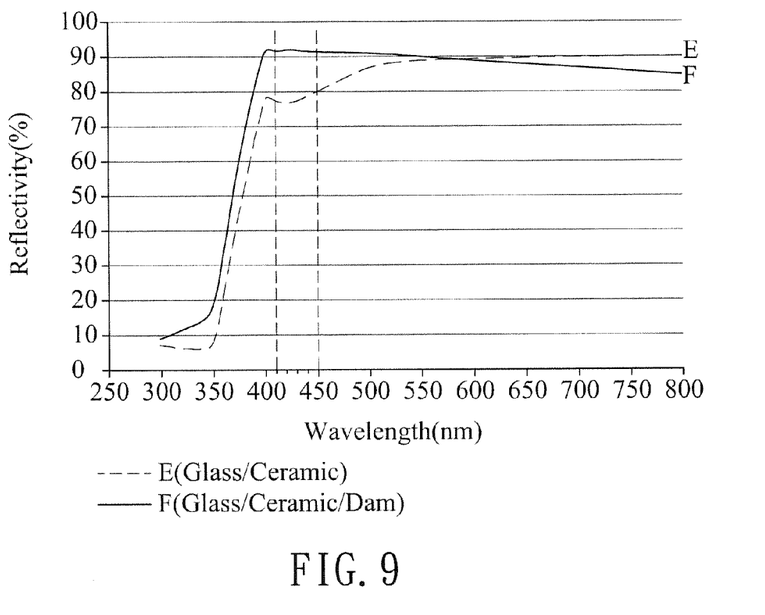
FIG. 9 is a plot illustrating influence of formation of a dam structure on increase in light reflectivity of the substrate of the LED device of the preferred embodiment.

FIG. 9 is a plot illustrating increase in light reflectivity of the substrate 11 of the LED device 1 of this invention by virtue of formation of the dam structure 17. In FIG. 9, curves E and F respectively stand for reflectivity of a combination of the substrate 11 and the glass layer 16 without the dam structure 17 and reflectivity of a combination of the substrate 11, the glass layer 16 and the dam structure 17. The relevant values are shown in the following Table 2.

TABLE 2

| nm | Reflectivity of a combination of the substrate 11 and the glass layer 16 without the dam structure 17 (Curve E) | Reflectivity of a combination of the substrate 11, the glass layer 16 and the dam structure 17 (Curve F) |
| --- | --- | --- |
| 450 | 80% | 91.5% |
| 410 | 77.5% | 91.8% |

As shown by curve E, the reflectivity at the wavelength of 410 nm is about 77.5% and the reflectivity at the wavelength of 450 nm is about 80%. After forming the dam structure 17, the reflectivity at the wavelength of 410 nm is about 91.8% and the reflectivity at the wavelength of 450 nm is about 91.5%. Therefore, by adopting the dam structure 17 on the substrate 11 with the glass layer 16, the reflectivity of the LED device 1 is improved.

Preferably, the dam structure 17 has a reflectivity higher than that of the glass layer 16 so that the reflectivity of a combination of the glass layer 16 and the substrate 11 underneath the dam structure 17 is increased from less than 80% to more than 90% at the wavelength range of 410 nm to 450 nm or even at the wavelength range of 320 nm to 480 nm.

Referring back to FIGS. 1 to 3, the encapsulated body 18 is formed within the dam structure 17 to encapsulate the LED chip unit 12. The encapsulated body 18 is made from silicone resin mixed with or without phosphor, and the silicone resin is a benzene ring-free silicone resin.

When the LED device 1 is operated with a high power density, crack of the encapsulated body 18 made from silicone resin tends to happen due to the temperature difference with the substrate 11. In this embodiment, the light-emitting area is exemplified to be 63.6 mm$^2$, and the input power is larger than 20 W. The power density is 0.3145 W/mm$^2$. The temperature difference (delta T) inside the light-emitting area tends to be greater than 20 degrees, which is for example at an abnormal condition.

Table 3 shows the experimental results of four silicone resins with or without phosphor in the test.

TABLE 3

(Delta T >20 C.)

| Silicone | n | CTE (1 × 10$^{-6}$/° C.) | Elongation (%) | Crack test (duration) |
| --- | --- | --- | --- | --- |
| A(w/o) | 1.4 | 283 | 118 | Crack (24 h) |
| A(w) | 1.4 | 261 | 76 | Crack (24 h) |
| B(W/o) | 1.4 | 276 | 46 | Crack (1 h) |
| B(W) | 1.4 | 257 | 40 | Crack (1 h) |
| C(W/o) | 1.4 | 267 | 88 | Crack(24 h) |
| C(W) | 1.4 | 255 | 55.6 | Crack(24 h) |
| D(W/o) | 1.4 | 323 | 148 | OK (>120 h) |
| D(W) | 1.4 | 266 | 131 | OK (>120 h) |

In Table 3, the refractive index (n) is less than 1.5. Preferably, the refractive index (n) of the encapsulated body 18 is about 1.4. A coefficient of thermal expansion (CTE) ranges from 250 to 270×10$^{-6}$/° C. Preferably, the elongation of the encapsulated body 18 contains phosphor is greater than 80%.

By use of the encapsulated body 18 that is made from a benzene ring-free silicone resin that contains phosphor and that has a refractive index (n) of less than 1.5, that has a coefficient of thermal expansion (CTE) ranging from 250 to 270×10$^{-6}$/° C. and elongation of greater than 80%, crack of the encapsulated body 18 during operation of the LED device 1 at a high power density and the substrate temperature difference of 20° C. can be avoided.

In view of the foregoing, by virtue of the abovementioned structural arrangement and selection of the substrate 11 and the encapsulated body 18, the LED device 1 of this invention is able to be mounted with an increased number of LED chips to enhance light efficiency and to have an improved reflectivity of the ceramic substrate and a reduced cracking risk of the silicone resin of the encapsulated body 18. Specifically, the substrate 11 has a thickness of 0.8-1.2 mm and has not only an improved strength to avoid structural break, but also no light leakage from the backside of the substrate 11. The substrate 11 has a reflectivity of 98% at a wavelength of 450 nm and a reflectivity of more than 100% at a wavelength of less than 400 nm, and thus, the lighting efficiency of the LED device 1 is improved and the LED device 1 is suitable for short-wavelength applications. By virtue of inclusion of the glass layer 16, contamination or oxidation of the circuit pattern 13 is avoided. By virtue of inclusion of the dam structure 17, the reflectively of the glass layer 16 is improved. The configuration of the oppositely spaced apart extending portions 1312, 1322 of the positive and negative electrodes 131, 132 in pair form results in optimization of the distances among the LED chips and improvement in the lighting efficiency of the LED device 1.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A light emitting diode (LED) device, comprising:
a substrate having a central portion;
an LED chip unit formed on said central portion of said substrate;
a circuit pattern having a positive electrode and a negative electrode that are formed on said substrate, each of said positive electrode and said negative electrode including an arc portion that extends along said central portion and at least one extending portion that surrounds said arc portion toward said central portion, said extending portion of said positive electrode being opposite to said extending portion of said negative electrode;
a wire unit connecting said LED chip unit to said extending portions of said positive electrode and said negative electrode;
a glass layer disposed on said substrate, covering said arc portions of said positive electrode and said negative electrode and, including an opening unit that is aligned with said central portion of the substrate;
a dam structure formed on said glass layer and extending along said arc portions of said positive electrode and said negative electrode; and
an encapsulated body disposed substantially within said dam structure to cover said extending portions of said positive electrode and said negative electrode, said LED chip unit and said wire unit.

2. The LED device of claim 1, wherein said substrate is a ceramic substrate having a surface roughness (Rz) of 0.5 to 1 μm, a coefficient of heat conductivity at 25° C. ranging from 15 to 24 W/mk, and a thickness ranging from 0.8 to 1.2 mm.

3. The LED device of claim 2, wherein said ceramic substrate includes an aluminum oxide-based material mixed with at least one of zirconium (Zr), calcium (Ca), barium (Ba) and magnesium (Mg).

4. The LED device of claim 1, wherein said substrate has a reflectivity of not less than 97% at a wavelength range of 400 nm to 450 nm.

5. The LED device of claim 1, wherein said substrate has a reflectivity of more than 100% at a wavelength range below to 400 nm.

6. The LED device of claim 1, wherein said substrate has an apparent porosity not greater than zero and determined by the formula of $$PA(\%)=[(Ww-Wd)/(Ww-Ws)]\times 100\%;$$

wherein
Wd stands for the weight of the substrate when is dried;
Ws stands for the weight of said substrate when is suspended in the water; and
Ww stands for the weight of the substrate when is removed from the water.

7. The LED device of claim 1, wherein each of said positive electrode and said negative electrode includes at least two of said extending portions that are spaced apart from each other so as to form two pairs of oppositely spaced apart extending portions.

8. The LED device of claim 7, wherein one of the two pairs of said oppositely spaced apart extending portions is connected to said LED chip unit, the other one of the two pairs of said oppositely spaced apart extending portion is adapted to be connected to a Zener diode.

9. The LED device of claim 1, wherein each of said positive electrode and said negative electrode includes four of said extending portions that are spaced apart from each other so as to form four pairs of oppositely spaced apart extending portions.

10. The LED device of claim 9, wherein three of the four pairs of said oppositely spaced apart extending portion is connected to said LED chip unit, the other one of said four pairs of oppositely spaced apart extending portion is adapted to be connected to a Zener diode.

11. The LED device of claim 9, wherein said LED chip unit includes two LED chip groups that are separately electrically connected between said oppositely spaced apart extending portions of one of said four pairs in a parallel manner.

12. The LED device of claim 10, wherein said LED chip unit includes an LED chip group that is electrically connected between said oppositely spaced apart extending portions of one of said four pairs.

13. The LED device of claim 1, wherein each of said positive electrode and said negative electrode includes at least three of said extending portions that are spaced apart from each other so as to form three pairs of oppositely spaced apart extending portions.

14. The LED device of claim 13, wherein two of the three pairs of said oppositely spaced apart extending portion are connected to said LED chip unit, the other one of the three pairs of said oppositely spaced apart extending portion is adapted to be connected to a Zener diode.

15. The LED device of claim 14, wherein said LED chip unit includes two LED chip groups that are respectively and electrically connected between said oppositely spaced apart extending portions of said two of the three pairs.

16. The LED device of claim 15, wherein each of said LED chip groups includes two LED chip sub-groups connected in a parallel manner.

17. The LED device of claim 8, wherein said extending portion each of said positive and negative electrodes has a shape selected from one of triangle and rectangle.

18. The LED device of claim 1, wherein said glass layer has a portion superimposed on said arc portions of said positive and negative electrodes of said circuit pattern, the portion having a width greater than 150 μm and a thickness greater than 10 μm.

19. The LED device of claim 1, wherein a distance between a peripheral edge of said substrate and a peripheral edge of said glass layer is about 200 μm.

20. The LED device of claim 1, wherein said extending portion of said circuit pattern has a curved surface for being connected to said wire unit, a distance between a highest point of said curved surface and a top surface of said substrate being greater than 15 μm, a distance between a lowest point of said cured surface and said top surface of said substrate being greater than 9 μm, a surface roughness (Rz) defined by a distance between the highest point and the lowest point being greater than 6 μm.

21. The LED device of claim 20, wherein said curved surface of each of said extending portions of said positive and negative electrodes has a wire-bonding sub-portion that is formed with the lowest point, and a peripheral sub-portion that is formed with the highest point and that extends from said wire-bonding sub-portion in a direction away from said arc portion, said peripheral sub-portion having a radian larger than 5 degrees and an extension length greater than 70 μm in the direction.

22. The LED device of claim 1, wherein said dam structure is configured as one of a one-layer form and a multi-layer form and partially covers said glass layer.

23. The LED device of claim 1, wherein said LED chip unit has a plurality of LED chips, said encapsulated body being made from a benzene ring-free silicone resin that contains phosphor, and having has one of properties of a refractive index (n) less than 1.5, a coefficient of thermal expansion (CTE) ranging from 250 to $270^{-6}/°$ C., and an elongation larger than 80% when the maximum temperature difference among said LED chips is larger than 20 degrees.

* * * * *